United States Patent [19]
Neu

[11] Patent Number: 5,429,488
[45] Date of Patent: *Jul. 4, 1995

[54] ENCAPSULATING MOLDING EQUIPMENT AND METHOD

[75] Inventor: H. Karl Neu, Furlong, Pa.

[73] Assignee: Neu Dynamics Corporation, Ivyland, Pa.

[*] Notice: The portion of the term of this patent subsequent to Apr. 11, 2012 has been disclaimed.

[21] Appl. No.: 275,651

[22] Filed: Jul. 15, 1994

Related U.S. Application Data

[63] Continuation of Ser. No. 108,335, Aug. 18, 1993, abandoned, which is a continuation-in-part of Ser. No. 52,545, Apr. 23, 1993, Pat. No. 5,405,255, which is a continuation-in-part of Ser. No. 981,742, Nov. 24, 1992, Pat. No. 5,316,463.

[51] Int. Cl.⁶ .............. B29C 45/02; B29C 45/14; B29C 45/34; B29C 45/27
[52] U.S. Cl. .............. 425/116; 264/272.17; 425/121; 425/129.1; 425/184; 425/186; 425/544; 425/546; 425/588; 425/812; 425/DIG. 228
[58] Field of Search ............ 425/812, 116, 121, 129.1, 425/544, 546, 588, 192 R, 184, 186, DIG. 228; 249/95, 91, 96, 141, 110; 264/272.17

[56] References Cited

U.S. PATENT DOCUMENTS

| | | | |
|---|---|---|---|
| 3,650,648 | 3/1972 | Lambrecht | 425/129.1 |
| 3,733,159 | 5/1973 | Coffman | 425/812 |
| 3,799,494 | 3/1974 | McLeen, Jr. | 425/812 |
| 3,813,201 | 5/1974 | Frederick et al. | |
| 3,859,023 | 1/1975 | Pasch | |
| 3,889,919 | 6/1975 | Ladney, Jr. | 425/812 |
| 4,044,984 | 2/1977 | Shimizu et al. | |
| 4,126,292 | 11/1978 | Saeki et al. | 249/110 |

(List continued on next page.)

FOREIGN PATENT DOCUMENTS

| | | | |
|---|---|---|---|
| 53-143656 | 12/1978 | Japan | 264/272.17 |
| 54-153866 | 12/1979 | Japan | 264/272.17 |
| 55-128835 | 10/1980 | Japan | |
| 57-18210 | 1/1982 | Japan | |
| 58-8608 | 1/1983 | Japan | 264/272.17 |
| 62-130531 | 6/1987 | Japan | 264/272.17 |
| 62-273814 | 11/1987 | Japan | |
| 1-170088 | 7/1989 | Japan | |
| 2-154434 | 6/1990 | Japan | 264/272.17 |
| 3-116939 | 5/1991 | Japan | |
| 2104827 | 3/1983 | United Kingdom | |
| 2248580 | 4/1992 | United Kingdom | 425/116 |

*Primary Examiner*—Khanh P. Nguyen
*Attorney, Agent, or Firm*—Synnestvedt & Lechner

[57] ABSTRACT

Encapsulation molding equipment includes individual mold bases each having an elongated shallow recess which receives strip-like carriers supporting semi-conductor chips and like objects for encapsulation. Cavity inserts having various numbers of cavities of different size and dimension individual to carriers having like numbers of chips of a range of size and dimension fit over the strips with each cavity on an insert surrounding the chip to be encapsulated. Gate and vent passages are formed on the surface of the insert spaced away from the mold base member for supply of resin from a central resin receptacle. Gate passages in the cavity inserts are configured to provide a restriction at the edge of each mold cavity, thereby accelerating the flow of liquid resin, rapidly filling the cavities and avoiding the entrapment of gas bubbles. The inserts have mold vent passages which allow for rapid venting of displaced gases from the cavities. The mold is completed by an upper mold insert plate which closes the mold and effects a seal between the mold parts and provides for delivery of encapsulating resin to the cavities in the cavity inserts. Each mold base has a plurality of recesses, each of which receives a carrier strip and a cavity insert.

18 Claims, 9 Drawing Sheets

U.S. PATENT DOCUMENTS

| | | | |
|---|---|---|---|
| 4,332,537 | 6/1982 | Slepcevic | 425/121 |
| 4,368,168 | 1/1983 | Slepcevic . | |
| 4,374,636 | 2/1983 | Holmes | 425/812 |
| 4,442,056 | 4/1984 | Slepcevic . | |
| 4,480,975 | 11/1984 | Plummer et al. | 425/544 |
| 4,513,942 | 4/1985 | Creasman . | |
| 4,599,062 | 7/1986 | Konishi . | |
| 4,620,958 | 11/1986 | Wiechard . | |
| 4,695,420 | 9/1987 | Grawey et al. . | |
| 4,697,784 | 10/1987 | Schmid . | |
| 4,779,835 | 10/1988 | Fukushima et al. | 425/116 |
| 4,795,331 | 1/1989 | Cain et al. | 425/812 |
| 4,812,114 | 3/1989 | Kennon et al. . | |
| 4,828,479 | 5/1989 | Pleasant . | |
| 4,829,670 | 5/1989 | Hilgers . | |
| 4,861,251 | 8/1989 | Moitzger | 425/116 |
| 4,862,586 | 9/1989 | Osada | 425/812 |
| 4,944,908 | 7/1990 | Leveque et al. . | |
| 5,008,062 | 4/1991 | Anderson et al. . | |
| 5,049,055 | 9/1991 | Yokoyama . | |
| 5,052,907 | 10/1991 | Matumoto et al. . | |
| 5,059,373 | 10/1991 | Hirabayashi . | |
| 5,077,237 | 12/1991 | Hara . | |
| 5,082,615 | 1/1992 | Sakai . | |
| 5,108,278 | 4/1992 | Tsutsumi et al. . | |
| 5,108,955 | 4/1992 | Ishida et al. . | |
| 5,123,823 | 6/1992 | Banjo et al. . | |
| 5,133,921 | 7/1992 | Yokoyama . | |
| 5,174,942 | 12/1992 | Barnadas . | |
| 5,316,463 | 5/1994 | Neu . | |

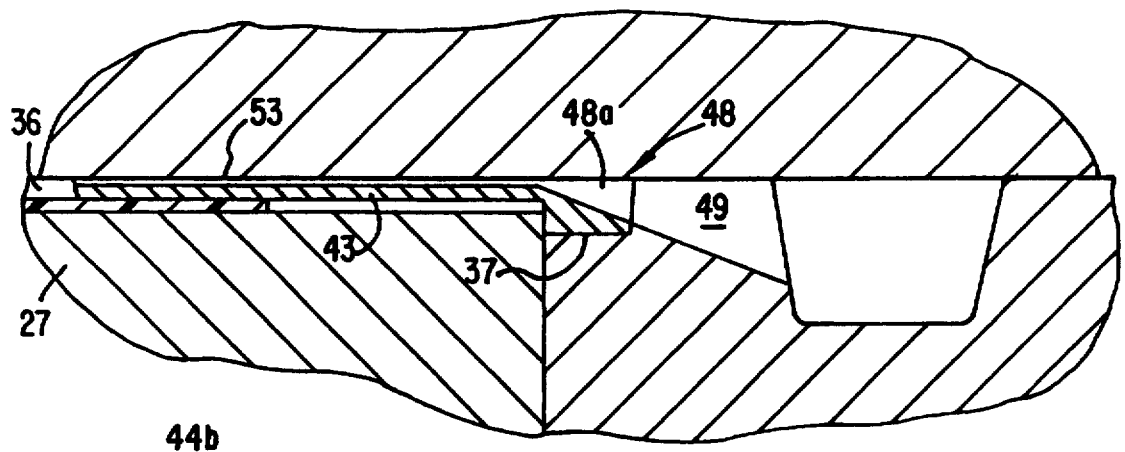
FIG. 8
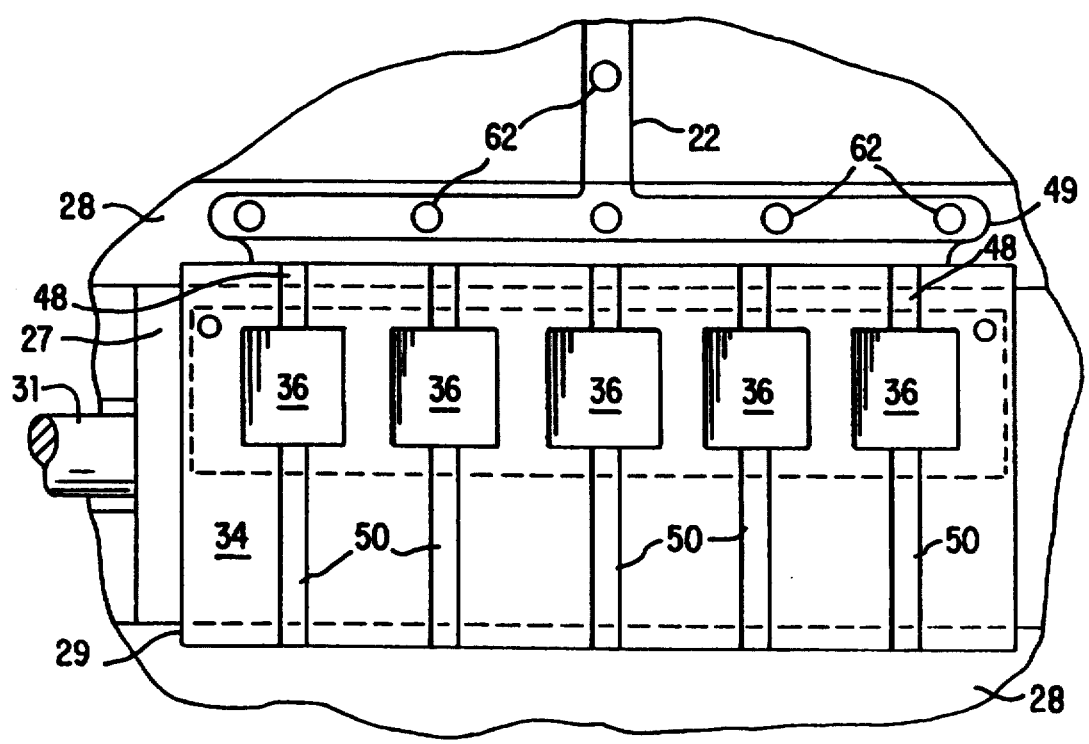
FIG. 11
FIG. 10

ENCAPSULATING MOLDING EQUIPMENT AND METHOD

RELATED APPLICATIONS

This is a continuation of U.S. application Ser. No. 08/108,335 filed on Aug. 18, 1993 now abandoned, which is a continuation-in-part of U.S. Ser. No. 08/052,545, filed Apr. 23, 19993 now U.S. Pat. No. 5,405,255, which in turn is a continuation-in-part of U.S. Ser. No. 07/981,742, filed Nov. 24, 1992 now U.S. Pat. No. 5,316,463.

FIELD OF THE INVENTION

This invention relates to the encapsulation molding of objects mounted on a strip-type carrier substrate and while not limited thereto is particularly directed to the encapsulation molding of electrical or electronic circuit components, such as semi-conductor chips previously fabricated on the carrier strip.

BACKGROUND OF THE INVENTION

Encapsulation molding equipment of the general kind referred to is disclosed, for example, in U.S. Pat. No. 4,368,168 dated Jan. 11, 1983. As disclosed in this patent, in the process of manufacturing semi-conductor chips, elongated strips, usually made of copper or other conductive metal, and commonly called lead frames are provided. The strips of conductive metal are conventionally fabricated by stamping to form support platforms for the chips and electrical leads extending from each platform in predetermined pattern to the strip boundaries or to narrow cross pieces according to the design of the particular chips to be mounted on the support platforms. As a final step in the manufacturing process, the leads are eventually severed from the cross pieces and the boundaries after the chips are formed on the platforms, encapsulated and ready for testing and shipment.

In encapsulating the chips, an extreme degree of care must be taken to avoid touching by the hands. In the case of modern semi-conductor chips, the static electricity passing through the delicate microcircuitry on account of touching the unprotected chip, as well as the transfer of contaminants from the fingers of workers, may render it nonfunctional. In order to avoid this, considerable care must be taken to eliminate physical handling. This has been accomplished in the past by relatively expensive and complicated molds which have a large number of parts which are difficult to operate and to clean following use and are subject to undue wear and damage. In addition, known molding equipment is adaptable to encapsulation molding on only one size chip requiring separate and rather complicated molds for each size chip or for each size of lead frame strip.

The molds of the invention are intended to be used in conjunction with readily available mold presses of the type manufactured, for example, by the Hull Corp. of Hatboro, Pa., U.S.A. Mold presses of the type described have relatively moveable upper and lower platen members. The upper platen member is provided with a vertically extending cylindrical passageway into which a charge of encapsulating material, such as an epoxy resin, is adapted to be placed. The resin in solid form is heated in a preheating oven prior to its deposit in the passageway so that it is already relatively soft in consistency. The resin is then placed within the cylindrical passageway where it is heated by heating elements extending around the passageway and becomes highly liquid within a relatively short period of time. A piston forces the liquified resin to flow from the bottom of the passageway outwardly through a series of runners to mold cavities for encapsulating objects as is known in the art.

SUMMARY AND OBJECTS OF THE INVENTION

The present invention involves the encapsulation of semi-conductor chips or similar objects fabricated on the surface of a carrier strip-type substrate which is preferably formed of a glass fiber reinforced epoxy material. The objects are encapsulated within a protective body preferably formed of a resin material, such as an epoxy, there being at least one and typically from about four to about six objects on each piece of carrier strip material. The invention in preferred form contemplates a method and apparatus for the encapsulation molding of plural, relatively thin chips mounted on one planar surface of strips formed of plastic material, such as glass fiber reinforced plastic material, and in particular, to a strip construction where the leads are integrally molded into the strip and terminate in a matrix of contact points on the other planar surface. The chips and the leads previously formed on the strip are placed in axially spaced relationship on the strip in groups of from one to about six chips. The invention is intended to accommodate strips of different width, thickness and length, as well as strips having a range of numbers of chips, as well as sizes of chips, disposed thereon and to minimize mold set time. The invention is of particular applicability to elimination of the entrapment of gases within a mold cavity and to the molding of very thin chips or like devices on a substrate.

In carrying out the invention, one or more removable loading bar members is adapted to be interfitted into recesses in the support surface of a support platform mounted on a platen of the mold press. Each loading bar member has an upper planar surface for support of any one of a group of chip carrying strips having different numbers or sizes of chips or strips which optionally may be of a range of lengths, thicknesses and widths. The invention further contemplates the provision of cover plates termed cavity inserts which have spaced apart cavities extending therethrough, there being one cavity insert reserved for each of the separate strips of the group of strips. The cavities within a cavity insert are equal in number to chips on the corresponding strip and are dimensioned so that they accept the chips to be encapsulated on that particular strip and receive a charge of encapsulating resin sufficient to encapsulate the chip within each cavity. An important aspect of the invention is the provision of a series of cavity inserts in which the walls of the cavities of a particular insert correspond in thickness to the height of the objects on a particular strip. Support means independent of the mold bars maintains the upper surface of all cavity inserts of the series coplanar with the surface of the support platform. Further in accordance with the invention, gate passages formed in the cavity inserts lead to each individual cavity for the particular strip. The gate passages are formed solely in the cavity inserts and are preferably formed on the surface of the cavity insert away from the removable loading bar. Gate passages formed in the inserts having a decreasing cross-section in the direction of the mold cavities provide for an acceleration of the liquid resinous material into each cavity. Vent passages for each cavity having a relatively large and increasing cross-section in turn produce an acceleration of the vented gases out of the cavity.

The invention further provides locating pins which locate the strips on a surface of a removable mold member and maintain the relative position of the mold base member, the strips and the cavity insert, independently of the dimensions of the particular strip within the group of strips which the mold is intended to receive.

The invention further contemplates the use of knockout pins for the removal of solidified resin from the mold runner structure when the mold press is opened and a gate runner construction which promotes break off of the resin within the runners from the encapsulated parts as the resin is removed from the runners in a manner which leaves substantially no flashing on the encapsulated object. Still further, the knockout means includes push pins which operate in sequence with the knockout pins to push out the removable loading bar from its supporting recess once the resin within the runners has been knocked-out and separated from the encapsulated parts.

In combination with the above, the invention provides means for vertical adjustment of the loading bar relative to the cavity inserts thereby accommodating substrates of a range of thicknesses. Preferably, the loading bars are yieldably mounted so that a uniform sealing pressure can be established between the loading bar, the cavity insert and the upper mold plate.

Advantages and objects of the invention are the provision of a mold structure comprising removable bars common to any one of a series of semi-conductor device carriers of a range of dimensions and having different numbers and/or sizes of semi-conductor devices carried thereon in combination with cavity inserts individual to each one of a group of carrier strips.

A further object of the invention is a provision of molding apparatus in which the member exposed to the greatest degree of wear and likelihood of damage, namely the mold cavity insert, is of relatively simple construction and can be readily replaced at low cost when worn without the need to replace other elements of the mold structure.

Still another object of the invention is the provision of a mold construction which is simple to clean following use and minimizes down time during the encapsulation molding of parts.

Another object of the invention is the provision of a mold construction which substantially eliminates set-up time when changing the mold for the encapsulation of one size of objects or substrate to another.

A further object of the invention is the provision of apparatus and method which accommodates differences in thickness of the epoxy board substrates, as well as differences in the dimensions and number of the objects to be encapsulated through the use of interchangeable mold cavity inserts.

A further object of the invention is the provision of knockout means for facilitating the removal of resin within the resin delivery runner system following encapsulation molding and the provides for removal of the mold from its support structure thereby facilitating production.

A still further object of the invention is the provision of a centering system for locating the chip carrying strips in position within the mold irrespective of differences in the number or size of the chips or the dimensions of the chip carrier strips.

Another objective of the invention is the provision of a strip locating system within the mold which allows for axial expansion of the elongated strips of strip material.

A still further object of the invention is the provision of a gate structure within the mold cavity insert which restricts the delivery of resin to the number of objects to be encapsulated thereby eliminating waste of resin.

Yet another object of the invention is the provision of gate and vent passages for the cavities configured to eliminate gas entrapment in the mold cavity by accelerating the flow of resin into the cavities and the rapid venting of gases displaced by the liquid resin.

A still further object of the invention is the elimination of voids and gas bubbles within the encapsulation resin surrounding electronic chips and other relatively small objects.

Other objects and advantages of the invention will become apparent from the following detailed description of the preferred embodiment of the invention.

DESCRIPTION OF THE DRAWINGS

FIG. 8 is a detail view on an enlarged scale of a portion of the mold structure shown in FIG. 7;

FIG. 10 is a partial plan view of the cavity insert illustrated in FIG. 2; and

FIG. 11 is a view of a chip carrier strip showing chips encapsulated using equipment of the present invention.

DETAILED DESCRIPTION OF THE PREFERRED EMBODIMENT OF THE INVENTION

Figure 1:
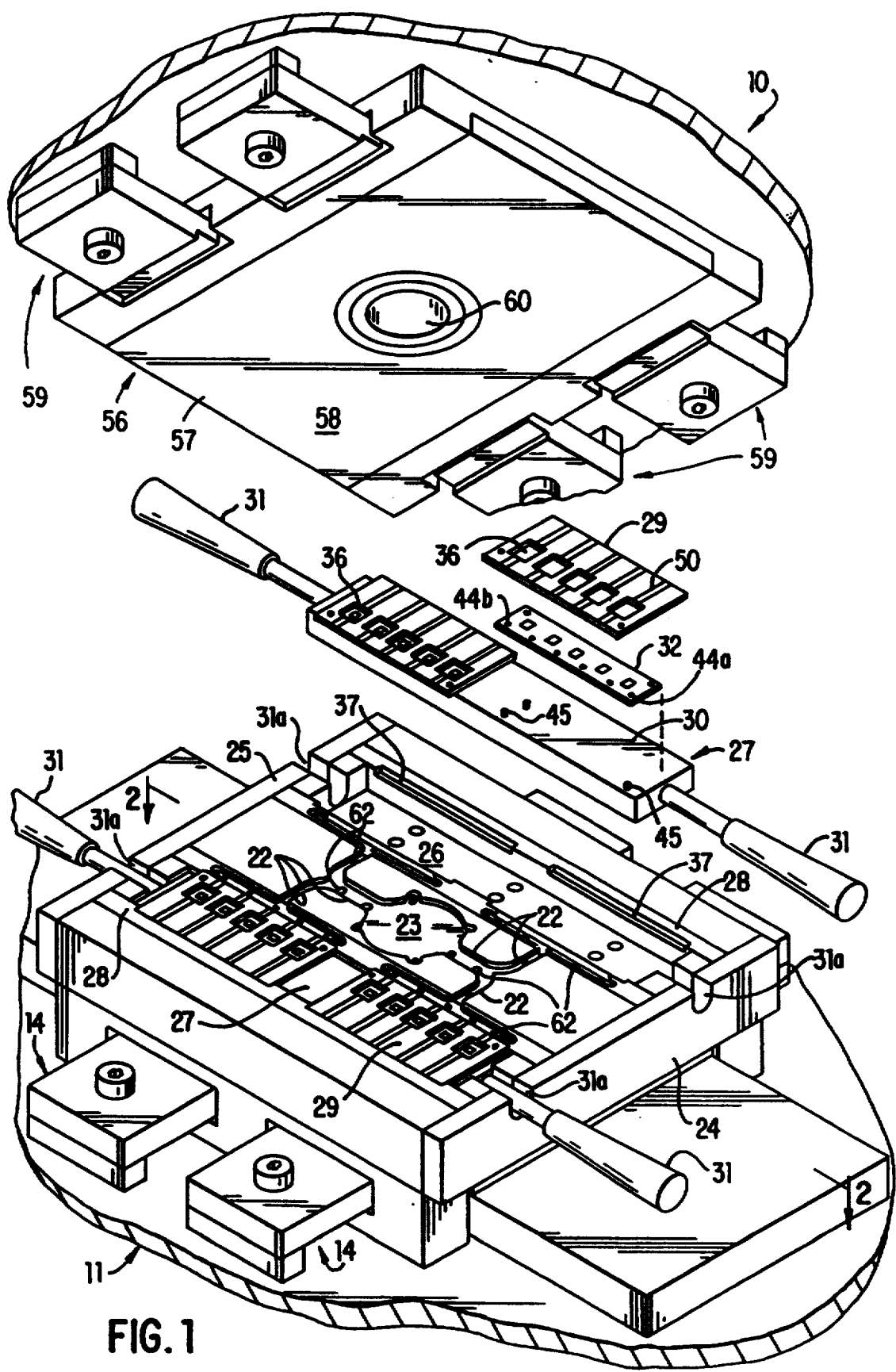
FIG. 1 is an exploded perspective view schematically representing molds formed in accordance with the present invention.
Figure 2:
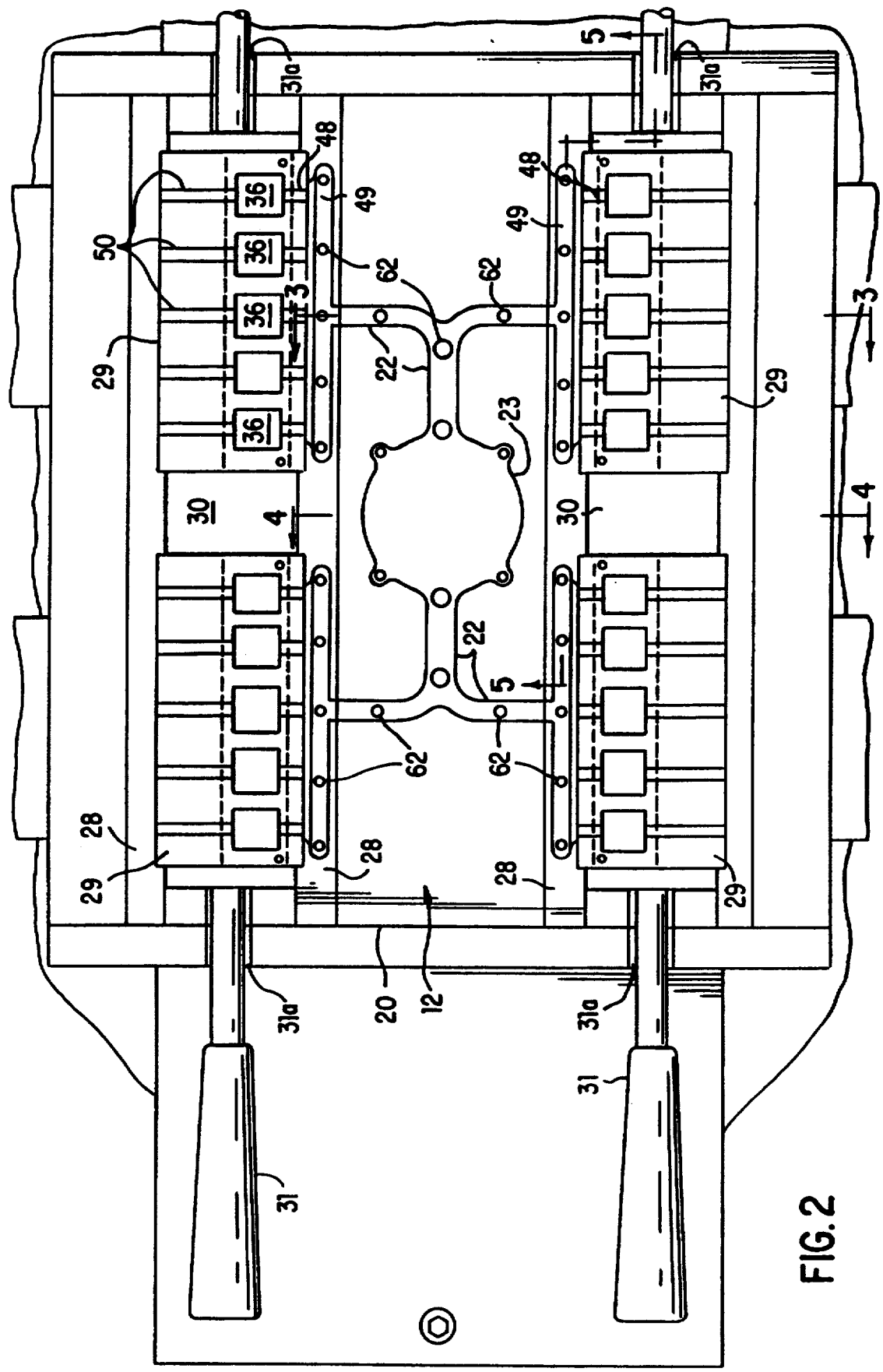
FIG. 2 is a plan view of the mold structure of FIG. 1 mounted on the lower platen member of a mold press.
Figure 3:
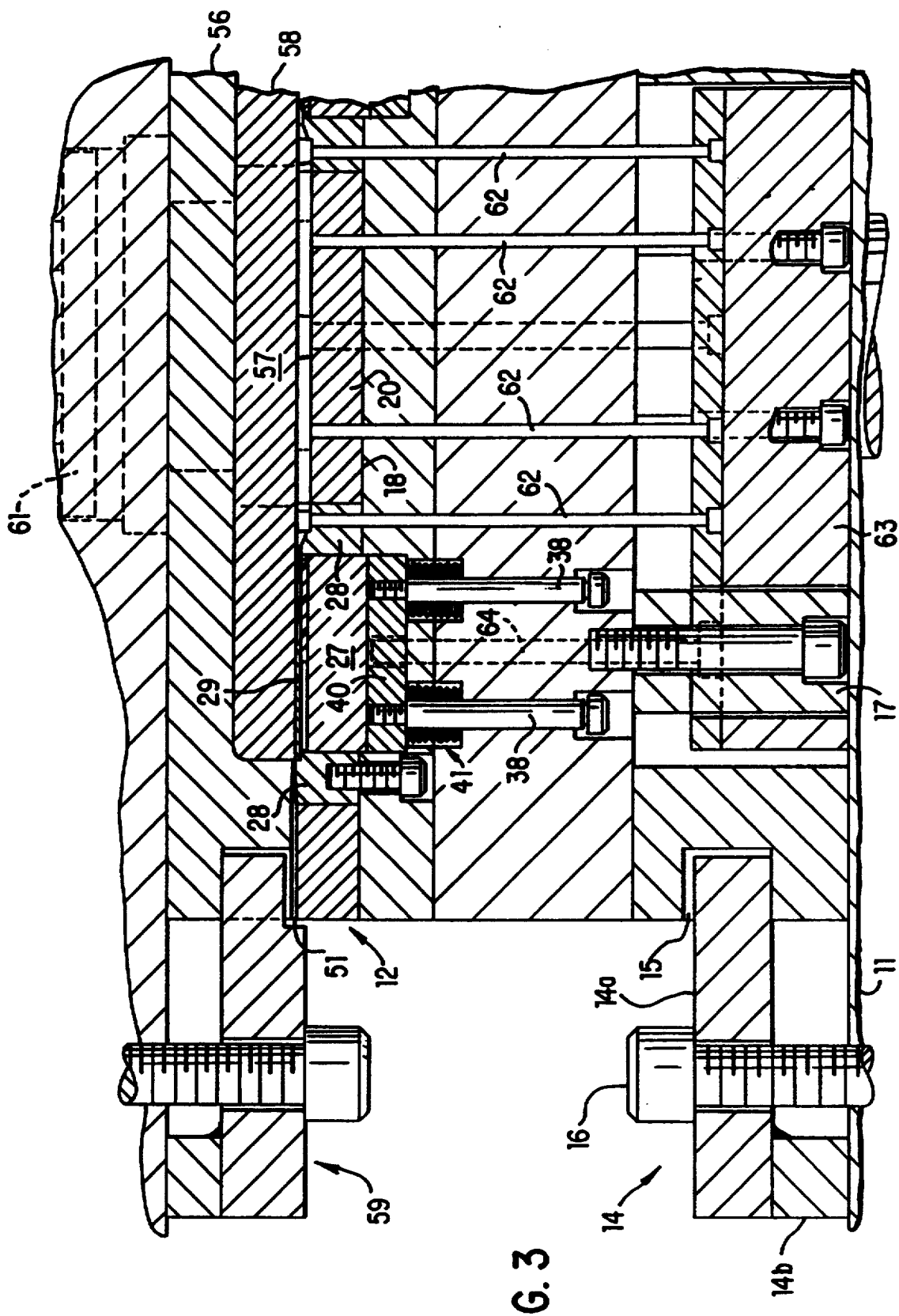
FIG. 3 is a sectional view taken on line 3—3 of FIG. 2.
Figure 4:
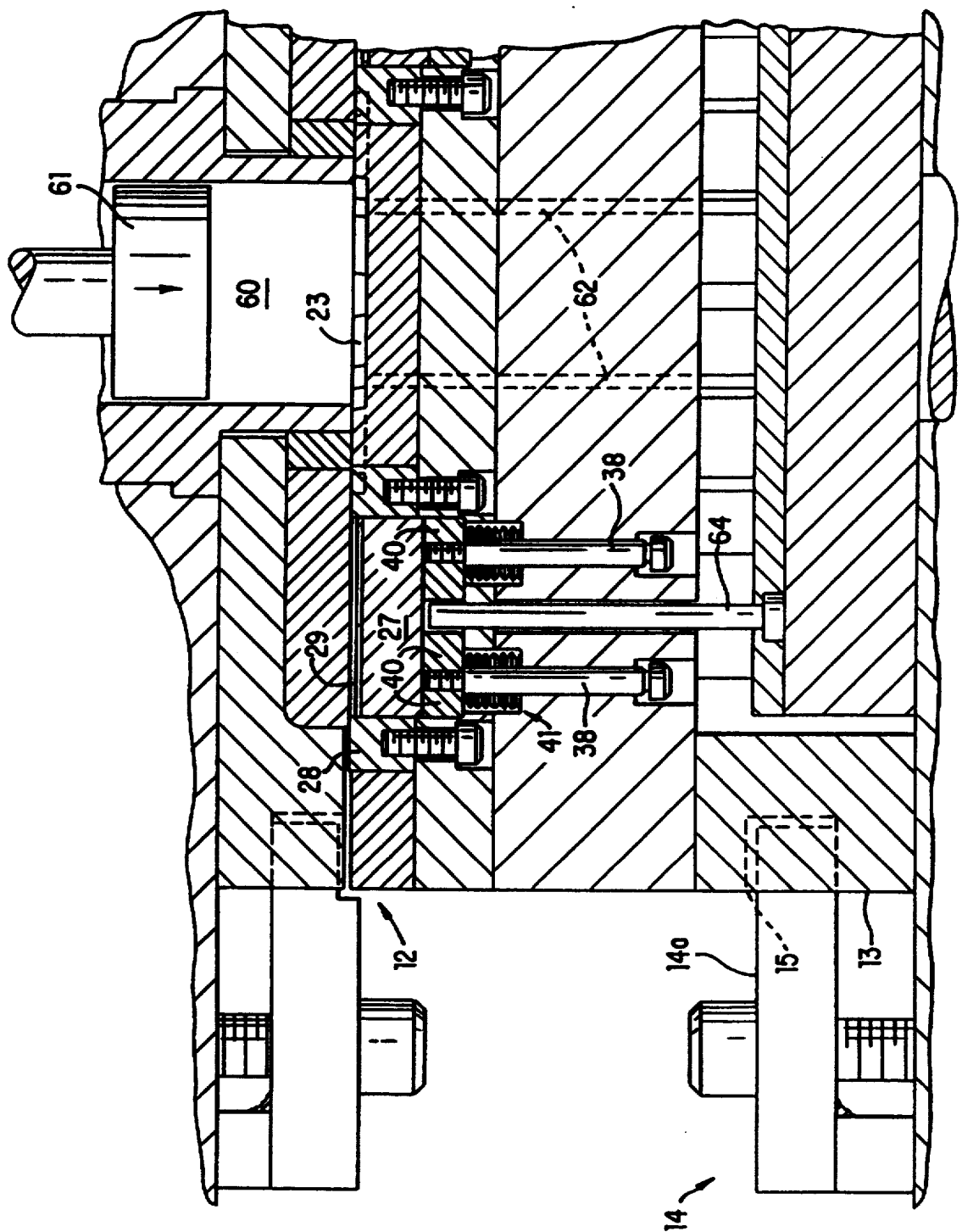
FIG. 4 is a sectional view taken on line 4—4 of FIG. 2.
Figure 5:
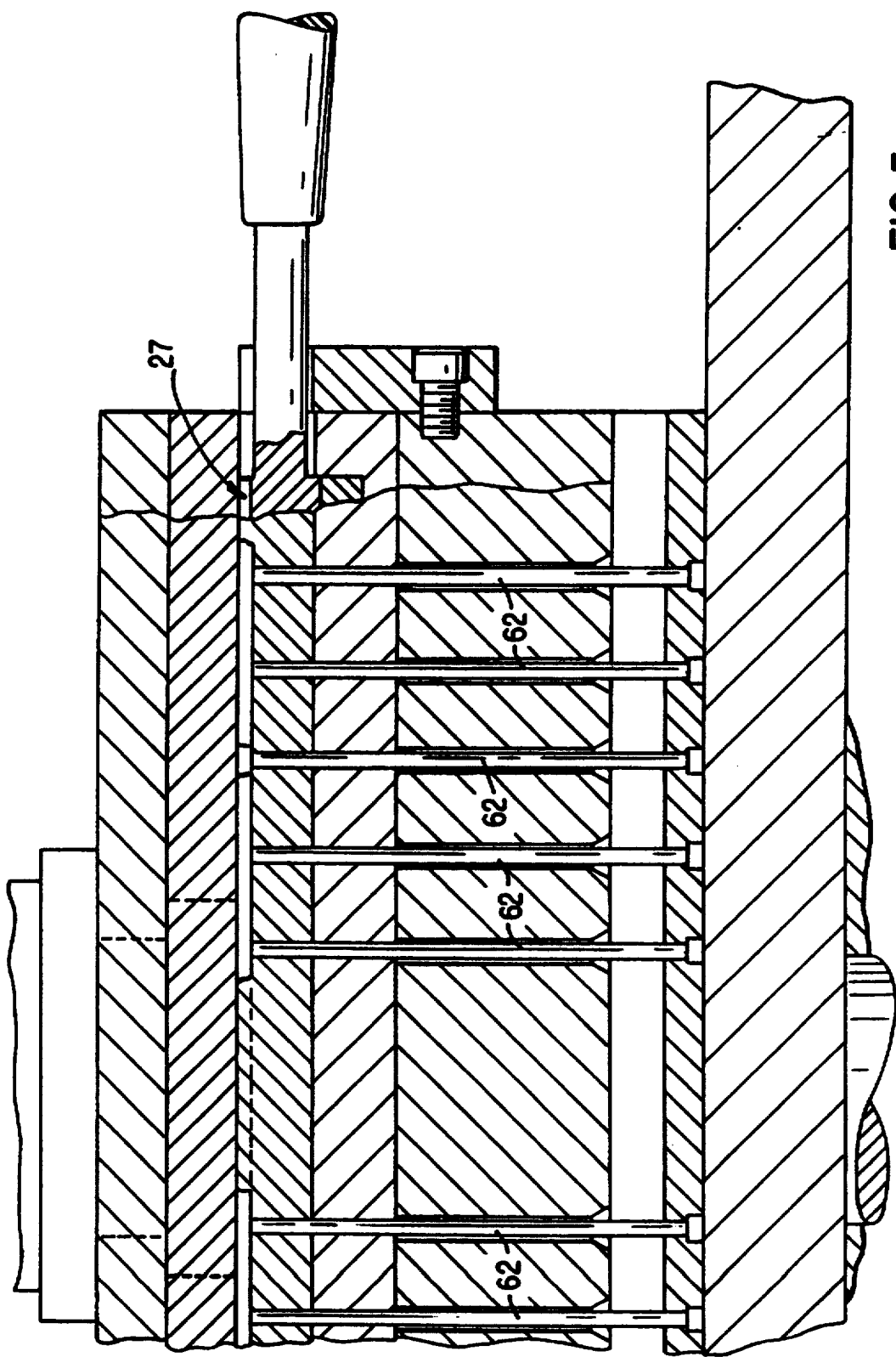
FIG. 5 is a sectional view taken on line 5—5 of FIG. 2.

Referring first to FIGS. 1-4, the molding apparatus of the present invention is mounted in a mold press comprising an upper platen member 10 and a lower platen member 11, both of which are mounted for relative vertical movement by means, not shown, between an open position and the position illustrated in FIGS. 3 and 4 wherein the mold parts supported on the lower platen member 11 are clamped and sealed together pursuant to a molding operation as is known in the art. The mold press is of conventional construction and is generally of a type supplied by the Hull Corp., more fully identified above.

In preferred form, as is best seen in FIGS. 3 and 4, the mold comprises an elevated mold support platform or plate 12 supported by elongated risers 13 which are clamped to the platen 11 by means of L shaped brackets 14. Brackets 14 have horizontally extending arms 14a which fit within spaced recesses 15 formed within the outer surface of risers 13 and bear against the platen on feet 14b. One or more machine bolts 16 directly bolt each bracket 14 to the lower platen 11 and clamp mold support platform 12 tightly in position. Support pillars 17 bolted to the underside of the platform may be provided as required to eliminate flexure when the parts of the mold are pressed together.

As best shown in FIGS. 2 and 3, mold support platform 12 has a central recessed portion 18 in the center of which an elongated center block 20 is mounted. As will be explained in more detail hereinafter, the upper surface of center block 20 provides a means for the delivery of liquified encapsulating resin through a series of branching runner passages generally indicated at 22 and which extend from a central recessed resin receptacle 23, as is best seen in FIGS. 1 and 2.

Figure 6:
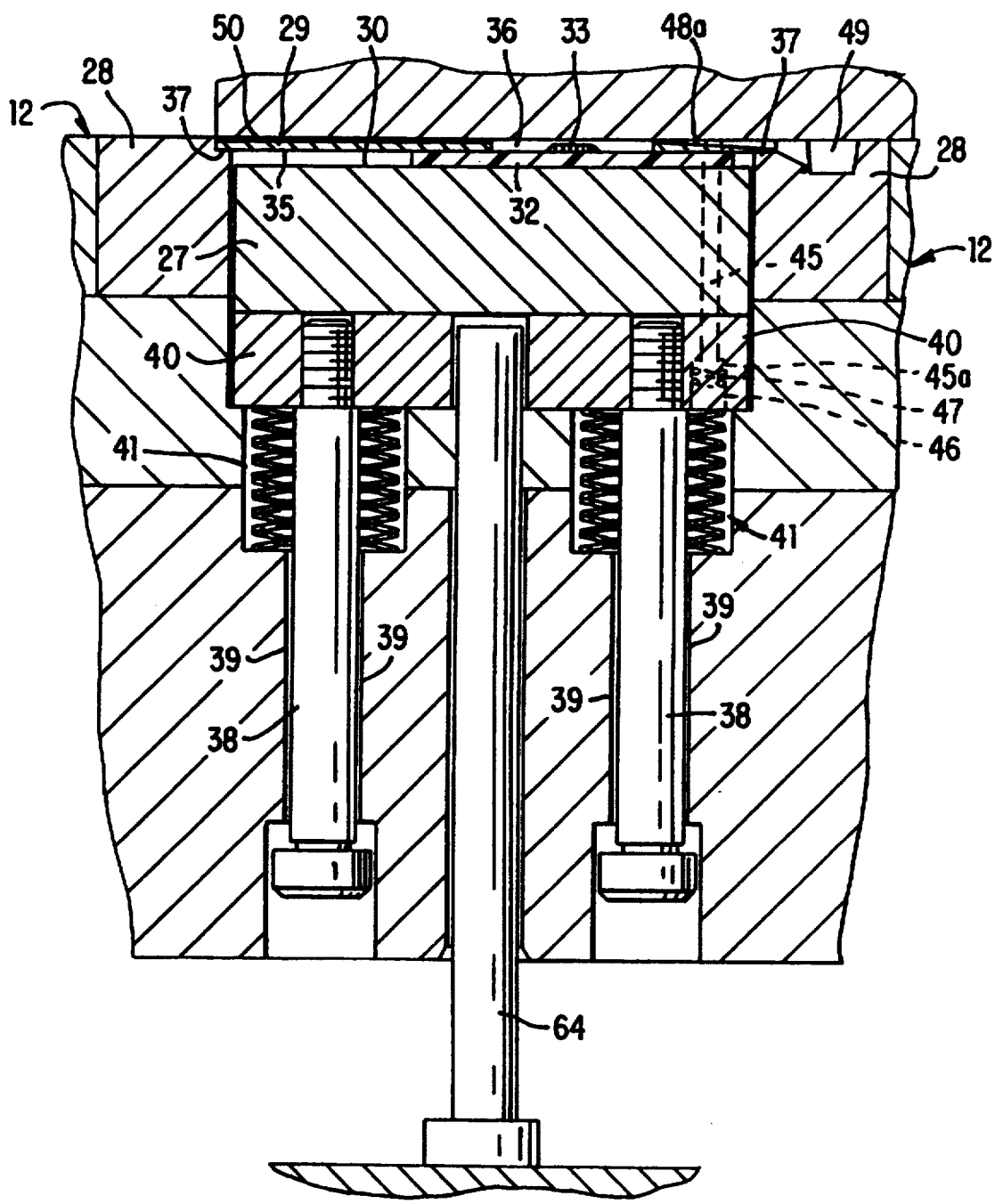
FIG. 6 is a fragmental view in cross-section of a mold of the present invention.

Also secured to the sides of platform 12 are side frame members 24 and 25 (FIG. 1). The center block, the side frame members and the raised end edges of the support platform define a pair of elongated mold support recesses 26 having vertical side walls. As is shown in FIGS. 3, 4 and 6, the sides of the recesses 26 are preferably defined by separate, removable side members 28 bolted to suitable supports underlying the platform 12.

The support recesses 26 receive removable elongated rectangular loading bars 27 which are intended to support the carrier strips on which the devices to be encapsulated are placed and covers termed cavity inserts 29 which have plural cavities 30 which are positioned to enclose the devices to be encapsulated and a charge of encapsulating resin.

Two loading bars 27 are illustrated in FIG. 1. Each loading bar 27 has an upwardly facing planar surface 30 for support of one or more carrier strips, as explained below. The loading bars further are preferably provided with handles 31 which extend from the bar ends and fit within notches 31a in the side frame members 24 and 25 to facilitate transportation, placement of a loading bar within the mold and its removal at the conclusion of a molding operation.

As stated above, the elongated carrier strips 32 carry a plurality of objects to be encapsulated, such as semiconductor chips. The chips are prefabricated on the strip surfaces and have leads extending therefrom as required. One such strip with chips 33 already encapsulated is illustrated in FIG. 11. Although chips fabricated on conventional lead frame strips stamped from a conductive material, such as copper, may be encapsulated using the equipment and method of the invention, the strips are preferably formed of a glass fiber reinforced plastic material, such as epoxy, and may have any number of chips, usually from about one to six, formed on the upper surface thereof in a predetermined spaced relationship. In the preferred embodiment, two carrier strips and two cavity inserts are provided for each loading bar.

The invention thus contemplates the provision of molding equipment intended for the encapsulation of plural objects, such as the semi-conductor chips of FIG. 11 of predetermined different sizes and especially of differing vertical dimension, as well as differences in number and spacial relationship on the strips. A particular feature of the invention involves the encapsulation of chips or other objects of a range of thicknesses using one of a group of cavity inserts each having cavities of a size individual to a particular size and spacing of the objects to be encapsulated. When change is required for encapsulating a different size or number of chips, the only mold part to be changed is the cavity insert. In addition, the invention is intended to accommodate strips that differ in length, width and strips of a range of thicknesses.

Figure 7:
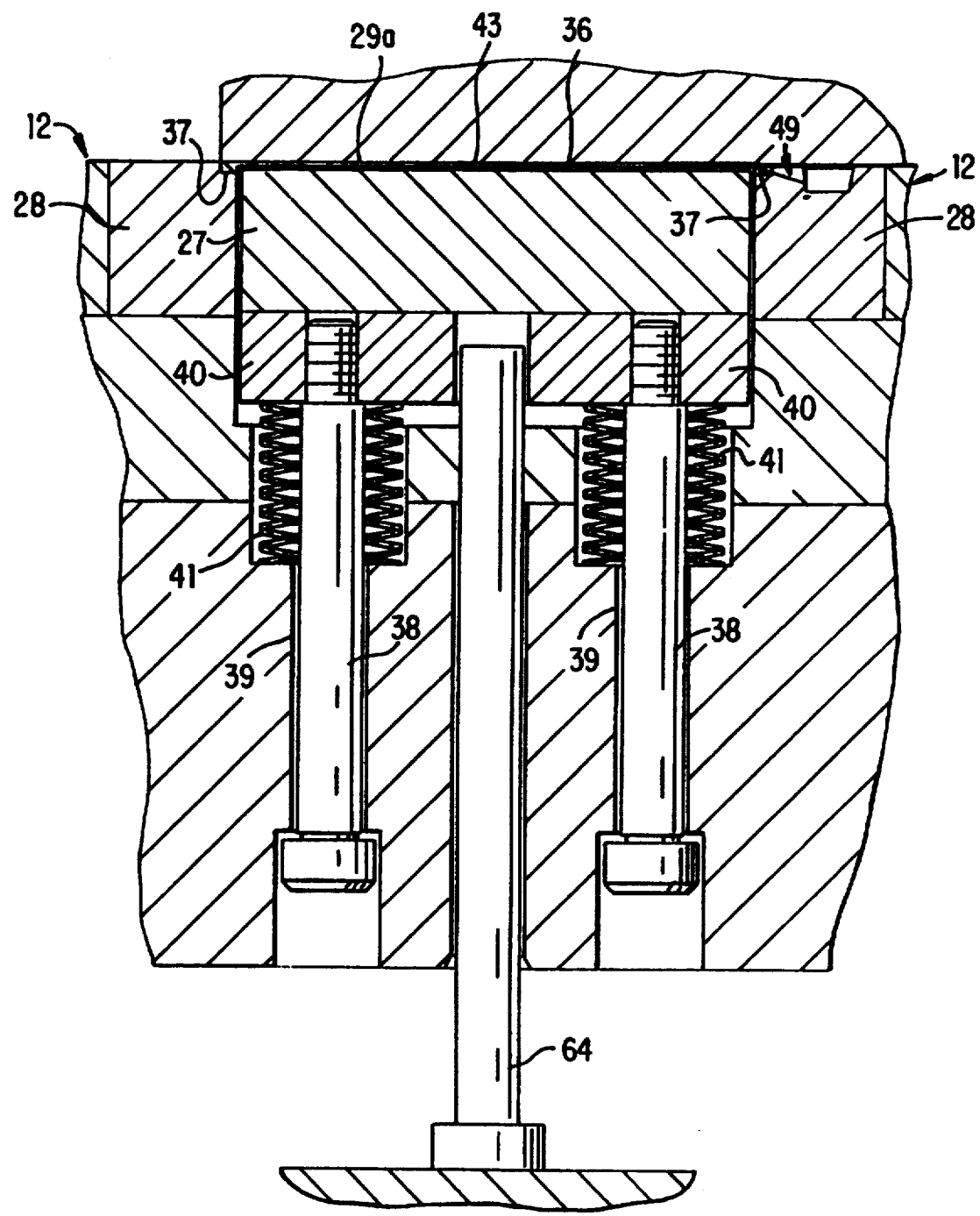
FIG. 7 is a fragmental view of a mold illustrating the use of a second form of cavity insert.

Two cavity inserts 29 and 29a for accommodating substrates having chips of two different thicknesses can be seen by comparing the sections illustrated in FIGS. 6 and 7. According to FIG. 6, a chip which is relatively large in height or thickness is accommodated by a relatively thick cavity insert 29. By way of example, insert 29 has a thickness of about 0.046 inches which experience has indicated is about as large as is likely to be required for the encapsulation of the larger size of modern chips. In the practice of the invention, insert 29 has an upper planar surface 34 and a lower planar surface 35 and a plurality of cavities 36 (see FIG. 10). FIG. 7 is similar to FIG. 6 with the exception of the provision of a different form of cavity insert 28a used for encapsulation of thinner devices on a thinner carrier strip. As illustrated, the cavity insert 29a has edge portions of equal thickness to the edge portions of cavity insert 29a so that the upper planar surface of the insert is coplanar with the lower mold surface surrounding the insert. As distinguished from insert 29, insert 29a has a relatively thin portion 43 which accepts a chip which is at the low end of the range of thicknesses of chips expected to be encapsulated.

Although two different cavity inserts for accommodating strips having chips of two different vertical dimension are illustrated in FIGS. 6 and 7, it is to be understood that others may be utilized and are considered to be within the scope of the invention. The various inserts may be either thicker or thinner than the inserts shown in FIGS. 6 and 7.

Means provided for support of the cavity inserts independent of the loading bars preferably comprise steps 37 formed in the upper planar surface of the lower mold plate 12 along the side edges of the recesses 26. In FIG. 6, the side edges of the inserts are supported on the steps 37. The upper surface of each insert is coplanar with the surface of mold plate 12 when the cavity insert is positioned on the steps 37.

As seen in FIGS. 3 and 6, sufficient space is provided underneath the cavity insert in which the carrier strip for the devices to be encapsulated is located. In preferred form as shown in FIGS. 3, 6 and 7, means are provided for vertical adjustment of the loading bar so that differences in the thickness of particular substrates can be accommodated. Although other means may be employed, the adjustable means preferably comprises elongated shoulder bolts 38 which are fitted into bores 39 and threaded into threaded openings in pressure insert plates 40 which support the loading bars 27. As shown, the upper end of each bore 39 is counterbored to accept a set of disc springs 41. By a variation in the number of disc springs 41, the height of the loading bar can be yieldably adjusted, thus assuring that a seal is established between the upper surface of the substrate and the lower surface of the cavity insert when the mold is assembled.

FIG. 7 also illustrates the adjusted position of the loading bar which is required when the chips are mounted on a relatively thin substrate. In FIG. 7, two additional disc springs 41 raise the loading bar 27 to provide a space between the loading bar upper surface and the lower surface of the cavity plate of 0.012 inches.

Means are provided for accurately locating the carrier strips on the upper surface of each loading bars 27 and the cavity inserts in appropriate position on the strips. In the preferred embodiment advantage is taken of the fact that, for other purposes, the strips 32 are already provided with a series of indexing openings 44. The openings 44 are preformed on the strips in predetermined, fixed positions for use in cooperation with indexing equipment for indexing the strips during other chip fabricating procedures. Although other notches or holes could be formed for the purpose, two such indexing openings, denominated 44a and 44b in FIG. 11, are used as positioning openings for locating the strips in fixed position on the loading bars. As can be seen in broken lines in FIG. 6, pins 45 extend upwardly from the surface of each loading bar recess 30 and fit within the openings 44a and 44b for the purpose of positioning each strip 32. Preferably, one of the pins should have a diameter substantially equal to the diameter of the corresponding opening so as to firmly locate one end of the strip axially of the cavity, whereas the other should be slightly smaller in an amount sufficient to allow for the calculated axial expansion of the strip which occurs due to the heat of the molding process.

In preferred form, provision is made for retraction of the pins so that their tips are moved downwardly into the openings in the cavity inserts 28 when the mold is closed. A preferred pin 45 is illustrated in FIG. 6. According to FIG. 6, the pins have an enlarged head 45a which fit within counterbores 46. A spring 47 urges each pin upwardly through the upper surface of the loading bar and an opening in the cavity.

In order to deliver liquified resin to the cavities within the inserts, cavity inserts 29 and 29a further have gate passages 48 which are preferably on that side of an insert which is opposite to the loading bar. The gate passages communicate with flood gates 49 which in turn communicate with the runners 22, thus providing a flow passage for the liquid resin extending directly from the common resin receptacle 23 into the cavities 36. A comparison of the gate passage configuration for the cavity inserts 28 and 28a can best be seen by reference to FIGS. 6 and 8. Each such gate passage has in common an upwardly sloping portion 48a which joins the upwardly sloping bottom of flood gate 49.

Shallow vent grooves 50 (FIGS. 3 and 6) extending from each cavity 36 are also preferably formed in the upper surface of the cavity inserts and allow for the venting of gas and any excess resin from the cavities through a clearance space 51.

The relatively shallow flat gate section 48a promotes fracture of the solidified resin so that it can be easily separated from the encapsulated part once the mold is opened.

Figure 8A:
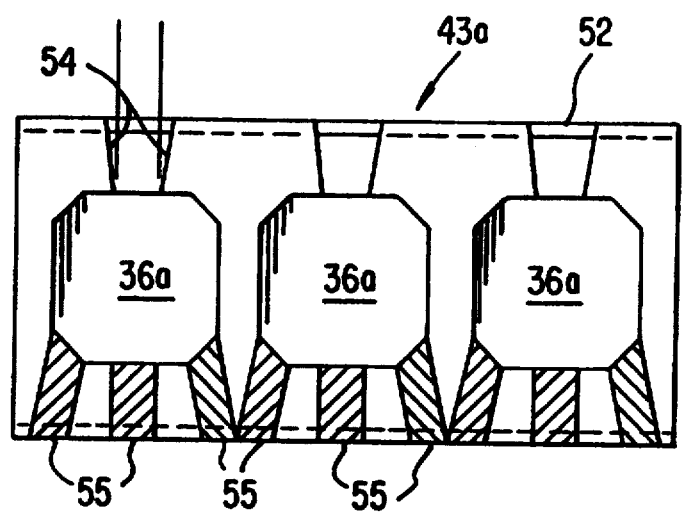
FIG. 8A is a plan view of an alterative form of the mold structure of FIGS. 7 and 8.
Figure 9:
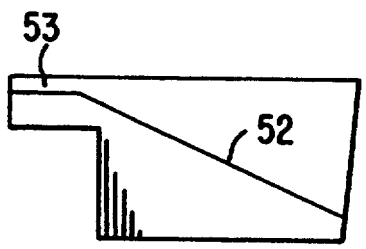
FIG. 9 is a detail view on an enlarged scale taken on line 9—9 of FIG. 8.

FIGS. 8A and 9 show a cavity insert 43a of a configuration similar to FIGS. 7 and 8 but having a modified form of gate and vent passages. As can be seen from FIGS. 8A and 9, the gate passages have upwardly sloping bottom wall section 52 overlying the outer edge portion, a relatively flat portion 53 and sidewalls 54 which are angled inwardly towards the entrance into each of cavities 36a. The arrangement disclosed provides a gate passageway having a progressively decreasing cross-section which serves to accelerate the flow of the liquid resin material into the cavity. This form of gate passage is of especial advantage in effecting rapid filling of the cavities and avoiding the entrapment of air bubbles.

Cavity insert 43a further has vent passages 55 of increasing cross-sectional area cavities. The relatively large and increasing cross-sectional area of the vent passages allows for a rapid acceleration of displaced gases from the cavities which helps to accelerate the flow of resin into the cavities and eliminates the entrapment of gas which otherwise might remain within a cavity.

In FIG. 8A, in an illustrative embodiment, the side walls of the gate passages are typically angled at about 10° with respect to a transverse axis. The side edge portions of the plate have a depth of 0.046 inches and the floor of the gate passages slope upwardly at an angle of about 25%. The central sections of the cavity plate has a thickness of 0.015 inches and the gate passage has a depth of 0.005 inches. At the entrance into a mold cavity, the gate passage has a width of 0.250 inches. The vent passages have a depth of 0.009 inches at the inner edge of a cavity insert and a depth of 0.0012 inches at the outer edge of the insert. The central vent passage for each cavity has a width of about 0.250 inches and the side vent passages have a width of about 0.200 inches. The vent passage cross-sectional area for each cavity is about 75% larger at the edge of the cavity insert than at the exit from the cavity.

Referring again to FIGS. 1 and 3, the upper mold structure comprises upper mold member 56 mounted on upper platen 10 and has a recess which receives an upper mold plate 57 having a lower planar surface 58. Upper mold member 56 is clamped in position on the upper platen 10 by any suitable means, such as brackets 59, which may be similar in construction to brackets 14.

Centrally located within the upper platen member 10 and extending through the upper mold member 56 and the upper mold insert plate 57 is a cylindrical resin receptacle 60. The resin receptacle 60 is in axial alignment with the central receptacle 23 which is located centrally of the lower plate 20.

As indicated above, upper platen 10 and lower platen 11 are adapted for relative vertical movement toward and away from one and another for opening and closure of the mold. When the platens are moved together, the mold surface 58 on upper mold insert plate 57 presses against the uppermost surface of each of the cavity inserts effecting a seal with the cavity inserts, as can be seen in FIG. 3 in which one cavity insert 29 is illustrated. In this position, the resin receptacle 60 also is in registry with and forms a seal around the perimeter of the resin receptacle 23. As is conventional in the art, encapsulating resin in pellet form is inserted into the upper end of the resin receptacle 60 in preheated and relatively soft form when the mold parts are clamped together. Heater means surrounding the receptacle within the upper platen rapidly reduce the resin to a highly liquid form within receptacle 23. As can be seen in FIGS. 3 and 4, a hydraulic operated piston 61, schematically represented, forces the resin outwardly through runner passages, through the cull and the gate passages so as to fill the mold cavities within each cavity insert.

Means are provided for facilitating the removal of the loading bars from the mold and the solidified resin from the runners and from the cull and the gate passages once the resin has solidified. As a preferred means to accomplish this, a series of resin knockout pins 62 are supported on a base plate 63 immediately beneath passages 22 and receptacle 23. Plate 63 rests on the platen 11 and is raised relatively to the platen 11 when the upper and lower platens move to the open position. The position of the knockout pins within the various runners can be seen in FIGS. 2 and 9.

Also mounted on platen 11 are push pins 64 (FIGS. 3, 4, 6 and 7) for knocking out the loading bars. The push pins are located immediately beneath the loading bars. The pins 62 and 64 are of a length relatively to one another such that when the mold opens, the knockout pins 62 first strike the solidified resin within the runners, lifting it up causing the resin to fracture within the narrow section of the gate immediately next to the encapsulated part. As the push pins 64 rise an additional amount, they then strike the bottom of the loading bars 27 pushing them out of their locating recesses. Thereafter as the mold parts move further apart, clearance is provided so that the operator can manually lift each loading bar from its support recess 26 by grasping the handles 31. Thereafter, the solidified resin which has been upset by the knockout pins can be manually removed and the mold is readied substantially immediately for reuse.

In operation of the molding equipment of the present invention, the loading bars 27 are loaded with carrier strips 32 each carrying a predetermined number of chips to be encapsulated. In loading the strips 32, the index openings 44 are fitted over pins 45, thereby positioning each strip on the loading bar upper surface. A cavity insert of form illustrated at 29, 43 or 43a having cavities corresponding to the number of chips on the particular epoxy board 32 and otherwise dimensioned so that the cavities correspond to those on the strip is placed on each loading bar 27. As can be seen in FIGS. 1 and 6, the locating pins 45 extend through the pair of openings in the cavity inserts so that each base member, strip and cavity insert is maintained in the intended relationship.

With the mold press open, a predetermined number of disc springs 41 are placed beneath pressure inserts 40 so that the loading bar is adjusted to the required height. The loading bars are next fitted into recesses 26, the side surfaces of the cavity inserts are supported on the steps 37. The mold is then closed, and preheated resin is then supplied to the upper opening in resin receptacle 60 and the piston 61 is actuated to force liquified resin from receptacle 23 through runners 22 into cavities 36.

Upon curing of the resin, the mold press opens, causing pins 62 to remove waste solidified resin from the runners 22 and the receptacle 23 and effecting a fracture of the resin within the shallow gate. Immediately thereafter, the knockout pins 64 raise the loading bars from the recesses 26.

I claim:

1. Equipment for encapsulation molding of objects on the upper surface of a rectangular carrier strip, wherein said carrier strip has a substantially flat lower surface, said molding equipment being adapted for use with a mold press having a base platen for support of the molding equipment and an upper platen, said base platen and said upper platen being relatively movable toward and away from one another, said molding equipment comprising:

(a) support means on said base platen including means defining an elongated, upwardly facing positioning recess having elongated side edges, a substantially horizontally disposed upwardly facing planar surface extended from an upper edge of said recess, encapsulating fluid delivery means, including at least one runner passage formed in the planar surface of said support means and extending to one of said elongated side edges;

(b) a carrier strip loading bar, said carrier strip loading bar interfitting within said recess, said carrier strip loading bar having side edges interfacing with the side edges of said recess, said carrier strip loading bar having an upwardly facing planar surface substantially free of surface irregularities for support of a carrier strip having objects to be encapsulated on its upper surface;

(c) a cavity insert for said carrier strip loading bar, said cavity insert having an upper planar surface, a plurality of spaced apart mold cavities extending through said cavity insert, said mold cavities corresponding in number to the objects on said carrier strip on said carrier strip loading bar and a lower surface surrounding each said mold cavity and adapted to interface with said carrier strip, each said cavity being dimensioned and positioned relatively to said objects to contain one of said objects and a charge of resin in an amount sufficient to encapsulate said object;

(d) cavity insert support means comprising fixed support surfaces for supporting of said cavity insert independently of said carrier strip loading bar;

(e) yieldable means for vertical adjustable support of said loading bar, the upper platen being in interengagement with the upper planar surface of said cavity insert and the upwardly facing planar surface of said support means when the upper platen and the base platen are relatively moved toward one other; and (f) gate passage means comprising gate grooves formed in the upper planar surface of said cavity insert, said gate grooves extending between each said cavity and said runner passage in the upwardly facing planar surface of said support means.

2. Equipment according to claim 1, wherein said gate grooves include side wall portions converging in the direction of each cavity so as to form a passage of restricted cross-sectional area at the entrance to the cavity; and vent passage means for venting said cavities and comprising vent grooves formed in the upper surface of said cavity insert, said vent grooves extending from said cavities and having an increasing cross-sectional area in the direction away from the cavities.

3. Equipment according to claim 2, wherein the said cavity insert has side edges having a first fixed dimension in thickness and a central region having a second fixed dimension in thickness less than the first fixed dimension in thickness and wherein said carrier strip is dimensioned to fit within said central region.

4. Equipment according to claim 2, wherein the cross-sectional area of the vent grooves increases by at least 50%.

5. Equipment according to claim 4, wherein the increase in cross-sectional area of the vent grooves is about 75%.

6. Equipment according to claim 5, wherein the vent grooves are of gradually increasing depth.

7. Equipment according to claim 6, wherein the wall portions of the gate grooves converge at an included angle of about 20°.

8. Equipment according to claim 2, wherein said gate grooves includes a sloped first bottom wall section, said sloped first bottom wall section extending upwardly through one of said side edge portions and a second bottom wall section extending from the sloped bottom wall section to the mold cavity.

9. Equipment for encapsulation molding of objects projecting upwardly from the upper surface of a rectangular carrier strip, wherein said carrier strip has a substantially flat lower surface, said molding equipment being adapted for use with a mold press having a base platen for support of the molding equipment, an upper platen overlying said base platen, said base platen and said upper platen being relatively movable toward one another to a position in which the mold is closed and relatively away from one another to a position in which the mold is opened, said molding equipment comprising:

(a) mold support means comprising an elongated, upwardly facing positioning recess on said base platen, said recess having elongated side edges and a raised planar surface, said raised planar surface extending to one of said elongated side edges;

(b) encapsulating fluid delivery means including at least one runner passage formed in said raised planar surface, said runner passage extending to said one of said elongated side edges;

(c) a carrier strip loading bar interfitting within said recess, said carrier strip loading bar having a planar substantially uninterrupted upper surface for support of said carrier strip having objects to be encapsulated on its upper surface;

(d) a cavity insert for said carrier strip loading bar, said cavity insert having an upper planar surface, a plurality of spaced apart mold cavities extending through said cavity insert, said mold cavities corresponding in number to the objects on said carrier strip disposed on said carrier strip loading bar and having a lower surface surrounding each said mold cavity and adapted to interface with said carrier strip, each said cavity of said cavity insert being dimensioned and positioned relatively to said objects to surround one of said objects and to contain a charge of resin in an amount sufficient to encapsulate said object;

(e) said mold support means further comprising fixed support surfaces independent of said loading bar, said cavity insert having edge portions extending beyond the loading bar and interfacing with said fixed support surfaces when the cavity insert is in overlying relationship with said carrier strip independently of said loading bar with the upper planar surface of the cavity insert being substantially coplanar with the raised planar surface of said mold support means;

(f) means biasing the loading bar relatively upwardly, whereby the upper surface of said carrier strip is moved into sealing relationship with the lower surface of the cavity insert; and (g) gate passage means comprising gate grooves formed in the upper planar surface of said cavity insert, said gate grooves extending from each said cavity to a runner passage in said raised planar surface of said mold support means.

10. Equipment according to claim 9, wherein said gate grooves include side wall portions converging in the direction of each cavity so as to form a passage of restricted cross-sectional area at the entrance to the cavity; and vent passage means for venting said cavities and disposed on the plate oppositely to the gate passage means, said vent passage means having an increasing cross-sectional area in the direction away from the cavities.

11. Equipment for encapsulation molding of objects projecting upwardly from the upper surface of a rectangular carrier strip, wherein said carrier strip has a substantially flat lower surface, said molding equipment being adapted for use with a mold press having a base platen for support of the molding equipment, an upper platen overlying said base platen, said base platen and said upper platen being relatively movable toward on another to a position in which the mold is closed and relatively away from one another to a position in which the mold is opened, said molding equipment comprising:

(a) positioning means on said base platen, said positioning means including a raised portion having a planar surface, said raised planar portion surface terminating in an elongated side edge portion;

(b) encapsulating fluid delivery means including at least one runner passage extending to said elongated side edge portion;

(c) a carrier strip loading bar positioned adjacent to said elongated side edge, said loading bar having a substantially uninterrupted planar upper surface for support of said carrier strip with the objects to be encapsulated disposed on its upper surface;

(d) a cavity insert for said carrier strip loading bar, said cavity insert having an upper planar surface, a plurality of spaced apart mold cavities extending through said cavity insert, said mold cavities corresponding in number to the objects on said carrier strip disposed on said carrier strip loading bar and having a lower surface surrounding each said mold cavity and interfacing with said carrier strip, each said cavity of said cavity insert being dimensioned and positioned relatively to said objects to surround one of said objects and to contain a charge of resin in an amount sufficient to encapsulate said object;

(e) said positioning means further comprising fixed support surfaces independent of said loading bar, said cavity insert having edge portions extending beyond the loading bar and interfacing with said fixed support surfaces when the cavity insert is in overlying relationship with said carrier strip for support of the insert independently of said loading bar with the upper planar surface of the cavity insert being substantially coplanar with the raised planar surface portion of said positioning means;

(f) means biasing the loading bar relatively upwardly, whereby the upper surface of said carrier strip is moved into sealing relationship with the lower surface of the cavity insert;

(g) gate passage means comprising gate grooves formed in the upper planar surface of said cavity insert, said gate grooves extending from each said cavity to a runner passage; and (h) the upper platen being in sealing relationship with the raised planar surface portion of said upper platen and the upper planar surface of said cavity insert when the mold is closed.

12. Equipment according to claim 11, wherein said gate grooves include side wall portions converging in the direction of each cavity so as to form a passage of restricted cross-sectional area at the entrance to the cavity; and vent passage means for venting said cavities and comprising vent grooves formed in the upper surface of said cavity insert, said vent grooves extending from said cavities and having an increasing cross-sectional area in the direction away from the cavities.

13. Equipment according to claim 12, wherein the cross-sectional area of the vent grooves increases by at least 50%.

14. Equipment according to claim 13, wherein the increase in cross-sectional area of the vent grooves is about 75%.

15. Equipment according to claim 14, wherein the vent grooves are of gradually increasing depth.

16. Equipment according to claim 15, wherein the wall portions of the gate grooves converge at an included angle of about 20%.

17. Equipment according to claim 12, wherein the said cavity insert has side edges having a first fixed dimension in thickness and a central region having a second fixed dimension in thickness less than the first fixed dimension in thickness and wherein said carrier strip is dimensioned to fit within said central region.

18. Equipment according to claim 12, wherein said gate grooves includes a sloped first bottom wall section, said sloped first bottom wall section extending upwardly through one of said side edge portions and a second bottom wall section extending from the sloped bottom wall section to the mold cavity.

* * * * *

UNITED STATES PATENT AND TRADEMARK OFFICE
CERTIFICATE OF CORRECTION

PATENT NO. : 5,429,488

DATED : July 4, 1995

INVENTOR(S) : H. Karl Neu

It is certified that error appears in the above-identified patent and that said Letters Patent is hereby corrected as shown below:

```
Column 1, line 9, change "19993" to --1993--

Column 3, line 63, change "the" to --then--

Column 12, line 10, change "on" to --one--
```

Signed and Sealed this

Seventeenth Day of October, 1995

Attest:

BRUCE LEHMAN

*Attesting Officer*     *Commissioner of Patents and Trademarks*